US010063368B2

(12) United States Patent
Morisaka

(10) Patent No.: US 10,063,368 B2
(45) Date of Patent: Aug. 28, 2018

(54) PHASE LOCKED LOOP CIRCUIT, RF FRONT-END CIRCUIT, WIRELESS TRANSMISSION/RECEPTION CIRCUIT, AND MOBILE WIRELESS COMMUNICATION TERMINAL APPARATUS

(71) Applicant: R.F. Architecture Co., Ltd., Tokyo (JP)

(72) Inventor: Shinichi Morisaka, Tokyo (JP)

(73) Assignee: R.F. ARCHITECTURE CO., LTD., Tokyo (JP)

(*) Notice: Subject to any disclaimer, the term of this patent is extended or adjusted under 35 U.S.C. 154(b) by 0 days.

(21) Appl. No.: 15/642,571

(22) Filed: Jul. 6, 2017

(65) Prior Publication Data

US 2017/0310459 A1 Oct. 26, 2017

Related U.S. Application Data

(63) Continuation of application No. PCT/JP2016/087454, filed on Dec. 15, 2016.

(30) Foreign Application Priority Data

Dec. 24, 2015 (JP) ................................ 2015-250864

(51) Int. Cl.
*H03D 3/24* (2006.01)
*H04L 7/033* (2006.01)
(Continued)

(52) U.S. Cl.
CPC ........... *H04L 7/0331* (2013.01); *H03L 7/091* (2013.01); *H03L 7/099* (2013.01); *H04B 1/40* (2013.01)

(58) Field of Classification Search
CPC .................................................... H04L 7/0331
(Continued)

(56) References Cited

U.S. PATENT DOCUMENTS 5,440,587 A * 8/1995 Ishikawa ............ H04L 27/2332 329/304
6,463,266 B1 * 10/2002 Shohara .................... H03J 7/04 375/219
6,653,906 B1 * 11/2003 Knecht .................. H03B 5/326 331/107 A

FOREIGN PATENT DOCUMENTS

JP H11-122121 A 4/1999
JP H11-122135 A 4/1999
(Continued)

OTHER PUBLICATIONS

International Search Report dated Feb. 14, 2017 for PCT/JP2016/087454 and English translation.

*Primary Examiner* — Lihong Yu
(74) *Attorney, Agent, or Firm* — Lucas & Mercanti, LLP

(57) ABSTRACT

A phase locked loop circuit that is capable of stabilizing a frequency of an input signal even in the case where the frequency is unstable is provided. The phase locked loop circuit that corrects a frequency error of an output signal from an oscillator to a predetermined target frequency; an ADC that converts the output signal to a digital signal; reference frequency output means that outputs a reference frequency signal; frequency error detection means that detects the frequency error based on the digital signal and the reference frequency signal; correction signal generation means that generates an error correction signal based on the frequency error; a DAC that converts the error correction signal to an analog signal; and a multiplier that multiplies the output signal by the analog signal to correct the frequency error of the output signal.

8 Claims, 9 Drawing Sheets

(51) Int. Cl.

| | |
|---|---|
| ***H04B 1/40*** | (2015.01) |
| ***H03L 7/091*** | (2006.01) |
| ***H03L 7/099*** | (2006.01) |

(58) Field of Classification Search
USPC .......................................................... 375/376
See application file for complete search history.

(56) References Cited

FOREIGN PATENT DOCUMENTS

| | | | |
|---|---|---|---|
| JP | 2001292030 | A | 10/2001 |
| JP | 2004241886 | A | 8/2004 |
| JP | 2006279798 | A | 10/2006 |
| JP | 2011147169 | A | 7/2011 |

* cited by examiner

PHASE LOCKED LOOP CIRCUIT, RF FRONT-END CIRCUIT, WIRELESS TRANSMISSION/RECEPTION CIRCUIT, AND MOBILE WIRELESS COMMUNICATION TERMINAL APPARATUS

CROSS-REFERENCE TO RELATED APPLICATIONS

This application is continuation application of International Patent Application No. PCT/JP2016/087454 filed on Dec. 15, 2016, which is based upon and claims the benefit of priority from the prior Japanese Patent Application No. 2015-250864, filed Dec. 24, 2015, the entire contents of which are incorporated herein by reference.

FIELD

The present invention relates generally to a phase locked loop circuit, and an RF front-end circuit, a wireless transmission/reception circuit, and a mobile wireless communication terminal apparatus that use the phase locked loop circuit.

BACKGROUND

The communication capacity by wireless communication through a mobile terminal such as a mobile phone, a smart phone, and a mobile router has been increasing year after year as the versatility of terminal apparatus has increased, and the distribution contents such as movie files or music files have been improved. The wireless communication technique has been developed to meet the above demands. Currently, the base station facilities or various terminal apparatuses compatible with the fourth generation (4G) communication standards have become widespread, and widely used in public.

In the aforementioned wireless communication terminal apparatuses, a signal transmitted or received through an antenna is called a radio frequency (RF) signal which has a high frequency. When an RF signal is received, the RF signal is multiplied by an output signal from a local oscillator to down-convert, and is converted to a band called a baseband which includes information to be actually communicated in an RF front-end circuit. When transmitting information, a baseband signal is multiplied by an output signal from the local oscillator to up-convert, and is sent as an RF signal via an antenna.

Generally, an oscillator such as a voltage controlled oscillator (VCO) is used as the local oscillator. The VCO is an oscillation circuit that controls output frequencies by a control voltage to be input. In general, the VCO is used as the local oscillator in which the control voltage is generated by a phase locked loop circuit, and a frequency error caused by various factors in a frequency of an output signal of the VCO is corrected.

For example, Patent Literature 1 describes a phase locked loop circuit in that an output of the VCO is input to an analog-to-digital converter (ADC), phase comparison is performed based on the converted digital data, and a control voltage of the VCO based on the comparison is output so as to stabilize the frequency.

In the communications of the fourth generation and onward, multi-value modulation such as 256 quadrature amplitude modulation (QAM) is used. For the use of the multi-value modulation, it is necessary to maintain the frequency of the local oscillator to be constant. Accordingly, the frequency of the local oscillator is stabilized by the phase locked loop circuit.

In addition, in the aforementioned fourth generation communication standards, the efficiency of use of the frequency band is increased by performing communication using multiple subcarriers, which is called an orthogonal frequency-division multiple access (OFDMA). The use of the local oscillator that has high spectral purity can prevent interference between subcarriers, and can increase the communication capacity by utilizing the frequency band more efficiently.

An example of an oscillator that has higher spectral purity is a surface acoustic wave (SAW) oscillator. The SAW oscillator is used with a phase locked loop circuit by stabilizing the output frequency. For frequency stabilization of the SAW oscillator, a method of adjusting an application voltage to a varicap (variable capacitance diode) is mainly used.

In addition, a multiple-input and multiple-output (MIMO) has been known as a technique for increasing the amount of wireless communication. This technique is to increase the communication capacity by using a transmitter and a receiver for wireless communication both of which have multiple transmission/reception systems each including an antenna, a modulator and a demodulator.

SUMMARY

As stated above, current wireless communication terminal apparatuses generally use the VCO as a local oscillator. One of the techniques for increasing the communication capacity is increasing the spectral purity of the local oscillator. However, there is a limitation to increase the spectral purity of the VCO.

The SAW oscillator is an oscillator that has spectral purity higher than the VCO, and accordingly, it is expected that the communication capacity is increased if the SAW oscillator can be used as a local oscillator. However, the SAW oscillator has low impact resistance and low temperature resistance. Thus, when the SAW oscillator is used for a wireless communication apparatus such as a mobile phone, there is a problem that it is difficult to obtain a stable output frequency when applying the aforementioned frequency stabilization by varicap.

Thus, an objective of the present invention is to provide a phase locked loop circuit that is capable of stabilizing the frequency of an input signal even in the case where the frequency of the input signal is unstable, and to provide a wireless transmission/reception circuit that is capable of increasing the communication capacity by using the phase locked loop circuit.

The present invention relates to a phase locked loop circuit that corrects a frequency error of an output signal from an oscillator to a predetermined target frequency. The phase locked loop circuit includes an ADC that converts the output signal to a digital signal; reference frequency output means that outputs a reference frequency signal; frequency error detection means that detects the frequency error based on the digital signal and the reference frequency signal; correction signal generation means that generates an error correction signal based on the frequency error; a DAC that converts the error correction signal to an analog signal; and a multiplier that multiplies the output signal by the analog signal to correct the frequency error of the output signal.

Accordingly, a frequency error in a frequency of the output signal is corrected by the method of combining the frequency correction signal generated based on the frequency error of the output signal from the oscillator to the target frequency so that stabilization can be realized even in the case where the frequency of the output signal of the oscillator is unstable.

It is possible to provide a phase locked loop circuit that is capable of stabilizing the frequency by correcting an error in a frequency of an output signal by using the method of combining a frequency correction signal with the output signal of the oscillator, and to provide a wireless transmission/reception circuit that is capable of increasing the communication capacity by using the phase locked loop circuit.

DETAILED DESCRIPTION

Embodiment 1

Figure 1:
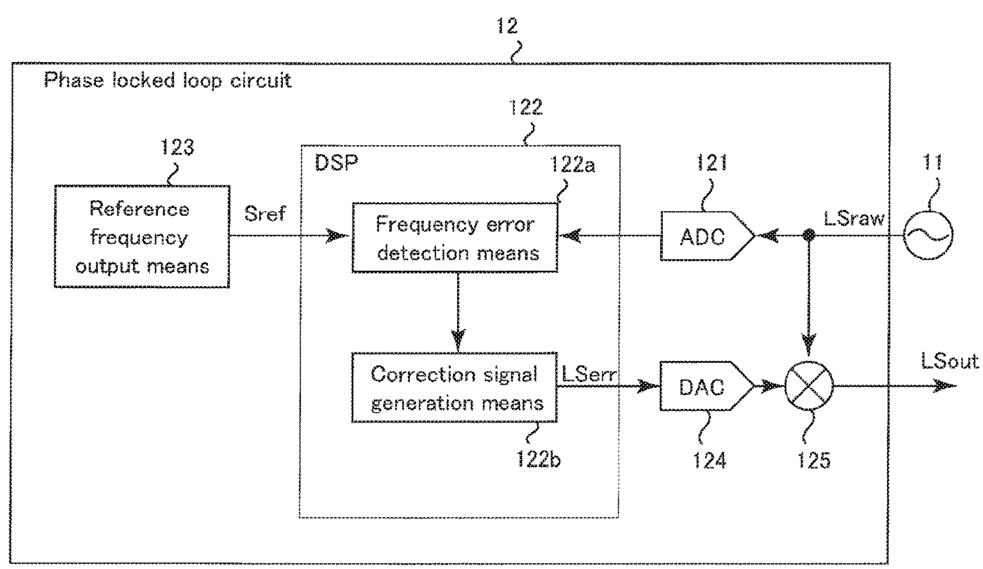
FIG. 1 shows a block diagram showing a phase locked loop circuit according to embodiment 1 of the present invention.

Embodiment 1 of the present invention will be described with reference to the drawings. FIG. 1 is a block diagram showing a phase locked loop circuit 12 according to the present embodiment. FIG. 1 is a usage example of the phase locked loop circuit 12 according to the present embodiment, in which a frequency fraw of an SAW oscillator output signal LSraw which is an output signal from an SAW oscillator 11 is corrected to a predetermined target frequency ftgt, the corrected frequency is stabilized, and a local oscillator output signal LSout used in a wireless transmission/reception circuit is output.

As shown in FIG. 1, the phase locked loop circuit 12 includes an ADC 121 that converts an SAW oscillator output signal LSraw which is an analog signal; a DSP 122 that receives the SAW oscillator output signal LSraw that has been converted to a digital signal, and generates an error correction signal LSerr to match a frequency fraw of the received SAW oscillator output signal LSraw with the target frequency ftgt; reference frequency output means 123 that outputs a reference frequency signal Sref having a reference frequency fref to the DSP 122; a DAC 124 that converts the error correction signal LSerr which is a digital signal to an analog signal; and a multiplier 125 that multiplies the SAW oscillator output signal LSraw which is an analog signal by the error correction signal LSerr which has been converted to an analog signal.

The DSP 122 further includes frequency error detection means 122*a* that receives the SAW oscillator output signal LSraw that has been converted to a digital signal and the reference frequency signal Sref, and detects a frequency error (a frequency shift) ferr which is a frequency error of the frequency fraw of the SAW oscillator output signal LSraw to the target frequency ftgt, and correction signal generation means 122*b* that generates an error correction signal LSerr having the frequency error ferr.

The DSP 122 is a digital signal processor, that is, a micro-processor for processing digital signal. It may be possible to use a central processing unit (CPU) instead of the DSP. However, since the frequency error detection means 122*a* and the correction signal generation means 122*b* require high-speed processing, it is preferable that the DSP compatible for such the processing is used.

In addition, an output signal from a crystal oscillator that has been converted to a digital signal, for example, may be used for the reference frequency signal Sref.

Figure 2:
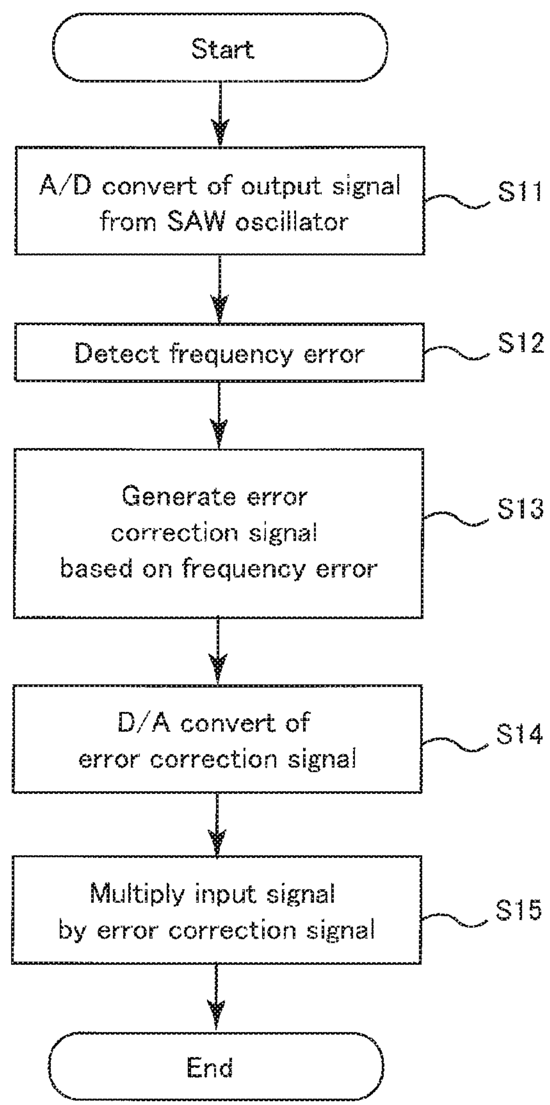
FIG. 2 shows is a flowchart of the frequency stabilization processing in embodiment 1 of the present invention.

FIG. 2 is a flowchart showing the correction processing for a SAW oscillator output signal LSraw by the phase locked loop circuit 12. First, in step S11, the ADC 121 converts a SAW oscillator output signal LSraw to a digital signal.

In step S12, the SAW oscillator output signal LSraw that has been converted to a digital signal and a reference frequency signal Sref are input to the frequency error detection means 122*a*, and an error between a frequency fraw of the SAW oscillator output signal LSraw and a target frequency ftgt is detected. As stated above, the objective is to obtain a local oscillator output signal LSout used in a wireless transmission/reception circuit. Accordingly, the target frequency ftgt is a high frequency band such as several hundred megahertz to several gigahertz. On the other hand, the reference frequency fref is a stable frequency in a frequency band of approximately several tens of megahertz.

Accordingly, detection of an error by the frequency error detection means 122*a* uses the reference frequency fref For example, the target frequency ftgt is equal to N-times (N is a discretionary number) the reference frequency fref, or the target frequency ftgt is equal to one-Nth of the reference frequency fref.

Then, the processing proceeds to step S13. The correction signal generation means 122*b* generates an error correction signal LSerr that has the frequency error ferr obtained in step S12. Specifically, the error correction signal LSerr is a sine wave that has the frequency error ferr.

In step S14, the DAC 124 converts the error correction signal LSerr to an analog signal.

Finally, in step S15, the multiplier 125 multiplies the SAW oscillator output signal LSraw which is an analog signal by the error correction signal LSerr converted to an analog signal. The frequency error ferr is a frequency indicating an error between the target frequency ftgt and the frequency fraw of the SAW oscillator output signal LSraw. The relationship between these frequencies is given as equation (1) below.

$$f_{err}=|f_{tgt}-f_{raw}| \quad (1)$$

Thus, the local oscillator output signal LSout obtained by multiplication at the multiplier 125 has the target frequency ftgt, as shown in equation (2) below.

$$f_{tgt} = \begin{cases} f_{raw} + f_{err}(f_{tgt} > f_{raw}) \\ f_{raw} - f_{err}(f_{tgt} < f_{raw}) \end{cases} \quad (2)$$

By the multiplication at the multiplier 125, both of a signal having a frequency (fraw+ferr), which is greater than the frequency fraw of the SAW oscillator output signal LSraw by the frequency error ferr, and a signal having a frequency (fraw-ferr) which is smaller than the frequency fraw of the SAW oscillator output signal LSraw by the frequency error ferr, indicated in equation (2) are obtained. Among these signals, a signal to be used as a local oscillator output signal LSout may be selected based on the comparison between the target frequency ftgt and the frequency fraw of the SAW oscillator output signal LSraw, as indicated as the conditions in equation (2).

Alternatively, the structure where the frequency error ferr can be a negative value, as indicated in equation (3), and an IQ modulator (quadrature modulator) is used as the multiplier 125 may be adopted.

$$f_{err} = f_{tgt} - f_{raw} \quad (3)$$

In this case, if the frequency fraw of the SAW oscillator output signal LSraw is smaller than the target frequency ftgt (ftgt>fraw), the frequency error ferr is a positive value. Accordingly, by multiplying the SAW oscillator output signal LSraw by the error correction signal LSerr, a signal having a frequency that is greater than the frequency fraw of the SAW oscillator output signal LSraw by an absolute value of the frequency error ferr can be obtained as a local oscillator output LSout. On the other hand, if the frequency fraw of the SAW oscillator output signal LSraw is greater than the target frequency ftgt (ftgt<fraw), the frequency error ferr is a negative value. Accordingly, by multiplying the SAW oscillator output signal LSraw by the error correction signal LSerr, a signal having a frequency that is smaller than the frequency fraw of the SAW oscillator output signal LSraw by an absolute value of the frequency error ferr can be obtained as a local oscillator output LSout.

As described above, the phase locked loop circuit 12 of the present embodiment can correct a frequency error of the SAW oscillator output signal LSraw to the target frequency ftgt, and output the local oscillator output signal LSout having the target frequency ftgt by the digital calculation processing by the DSP 122.

Next, a wireless transmission/reception circuit according to the embodiment which uses a circuit, which includes the SAW oscillator 11 and the phase locked loop circuit 12 as shown in FIG. 1, as a local oscillator will be described.

Figure 3:
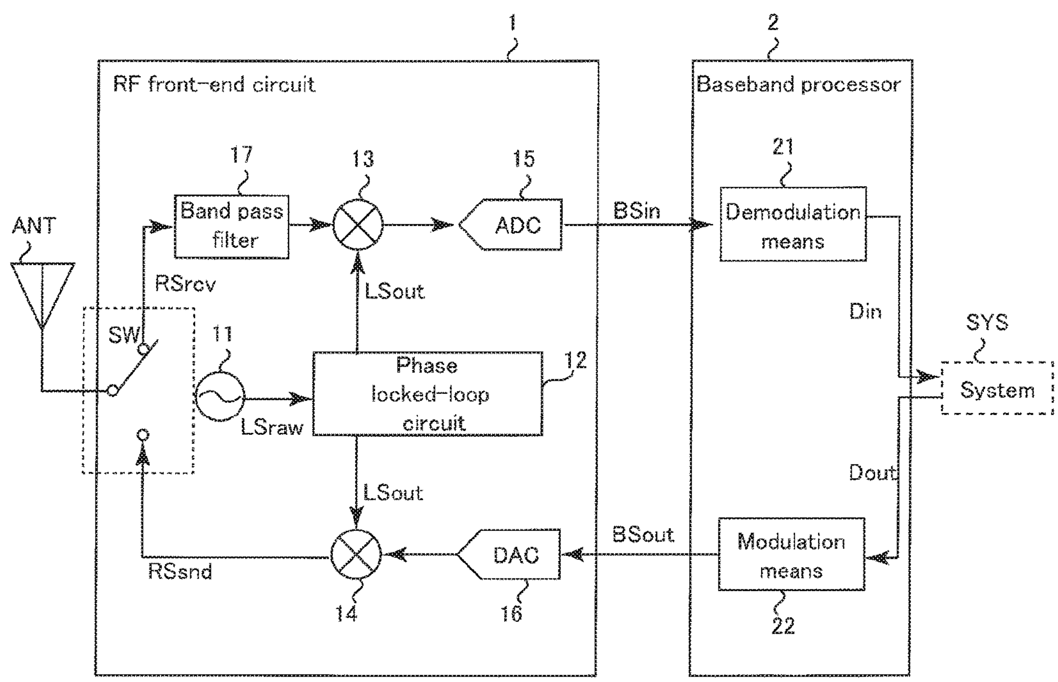
FIG. 3 shows is a block diagram showing a wireless transmission/reception circuit according to embodiment 1 of the present invention.

FIG. 3 is a block diagram showing the wireless transmission/reception circuit according to the present embodiment. As shown in FIG. 3, the wireless transmission/reception circuit according to the present embodiment includes an antenna ANT that transmits and receives a radio signal; an RF front-end circuit 1 that converts a reception signal RSrcv received by the antenna ANT to a baseband input signal BSin, and converts a baseband output signal BSout to a transmission signal RSsnd to be transmitted by the antenna ANT; and a baseband processor 2 that outputs of input data Din to a system SYS by demodulating the baseband input signal BSin, and outputs the baseband output signal BSout by modulating the output data Dout from the system SYS.

The RF front-end circuit 1 includes the SAW oscillator 11; the phase locked loop circuit 12; a transmission/reception switch SW that switches transmission and reception by the antenna ANT; a bandpass filter 17 that extracts a signal of a required frequency band from a reception signal RSrcv; a multiplier 13 that multiplies the reception signal RSrcv after the bandpass filter 17 is applied by a local oscillator output signal LSout, and outputs a baseband input signal BSin; an ADC 15 that converts the baseband input signal BSin to a digital signal; a DAC 16 that converts the baseband output signal BSout to an analog signal; and a multiplier 14 that multiplies the baseband output signal BSout converted to an analog signal by the local oscillator output signal LSout.

The baseband processor 2 includes demodulation means 21 that demodulates a baseband input signal BSin and generates input data Din for the system SYS; and modulation means 22 that modulates output data Dout from the system SYS and generates a baseband output signal BSout.

The system SYS is a discretionarily selected system that requests transmission/reception of data by wireless communication. For example, in the case where the wireless transmission/reception circuit according to the present embodiment is adopted to a mobile phone or a smart phone terminal, the system SYS may be input/output through an operating system (OS, basic software) or one of various application programs through the OS. Otherwise, in the case where the wireless transmission/reception circuit according to the present embodiment is adopted to the base station of a mobile phone, etc., the system SYS may be a system that controls the base station.

In addition, the local oscillator output signal LSout is a signal having the target frequency ftgt in which the frequency fraw of the SAW oscillator output signal LSraw is stabilized, as stated above.

Figure 4:
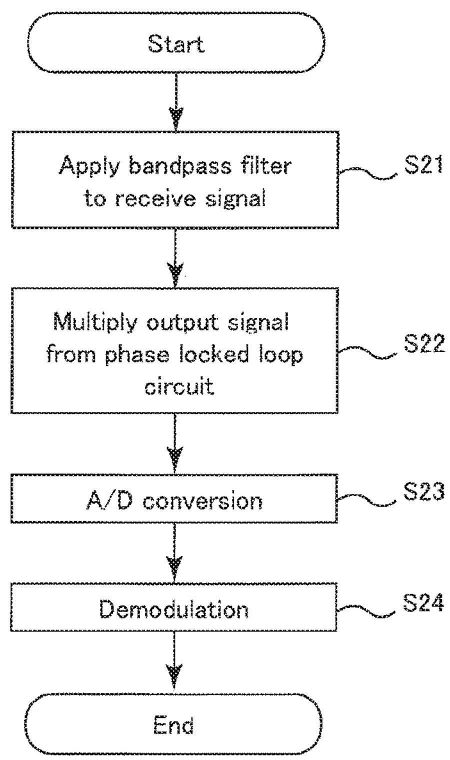
FIG. 4 shows a flowchart of the data receiving processing in embodiment 1 of the present invention.

FIG. 4 is a flowchart showing the processing of demodulating a reception signal RSrcv and obtaining input data Din by the wireless transmission/reception circuit according to the present embodiment. First, in step S21, the bandpass filter 17 is applied to a reception signal RSrcv to extract only a signal having a required frequency band from the reception signal RSrcv.

Then, the processing proceeds to step S22. The multiplier 13 multiplies the reception signal RSrcv passing through the band pass filter and a local oscillator output signal LSout to generate a baseband input signal BSin.

In step S23, the baseband input signal BSin is converted to a digital signal. In step S24, the baseband input signal BSin converted to the digital signal is demodulated to generate input data Din to be input to the system SYS. The processing is completed by this step.

As stated above, according to the wireless transmission/reception circuit of the present embodiment, by demodulating a reception signal RSrcv, input data Din to the system SYS can be obtained.

Figure 5:
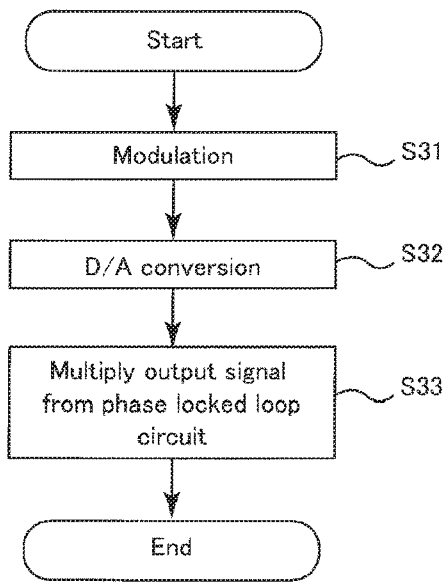
FIG. 5 shows a flowchart of the data transmission processing in embodiment 1 of the present invention.

FIG. 5 is a flowchart showing the processing of modulating output data Dout of the system SYS and obtaining a transmission signal RSsnd by the wireless transmission/reception circuit according to the present embodiment. First, in step S31, output data Dout from the system SYS is modulated, and a baseband output signal BSout is generated.

In step S32, the DAC 16 converts the baseband output signal BSout to an analog signal.

In the subsequent step S33, the baseband output signal BSout converted to an analog signal is multiplied by a local oscillator output signal LSout to generate a transmission signal RSsnd to be sent from the antenna ANT.

As stated above, according to the wireless transmission/reception circuit of the present embodiment, by modulating output data Dout from the system SYS, a transmission signal RSsnd can be obtained.

The receiving processing as shown in FIG. 4 and the transmission processing as shown in FIG. 5 may be performed respectively by switching the transmission/reception switch.

Accordingly, using the phase locked loop circuit 12 of the present embodiment realizes the configuration of the wireless transmission/reception circuit in which the SAW oscillator 11 is used as a local oscillator. With this configuration, the problem of the SAW oscillator which has low resistance properties to external impacts or temperature change can be solved by frequency stabilization by digital calculation processing using the phase locked loop circuit 12, and the advantages of the SAW oscillator which has a high spectral purity can be applied.

Embodiment 2

Figure 6:
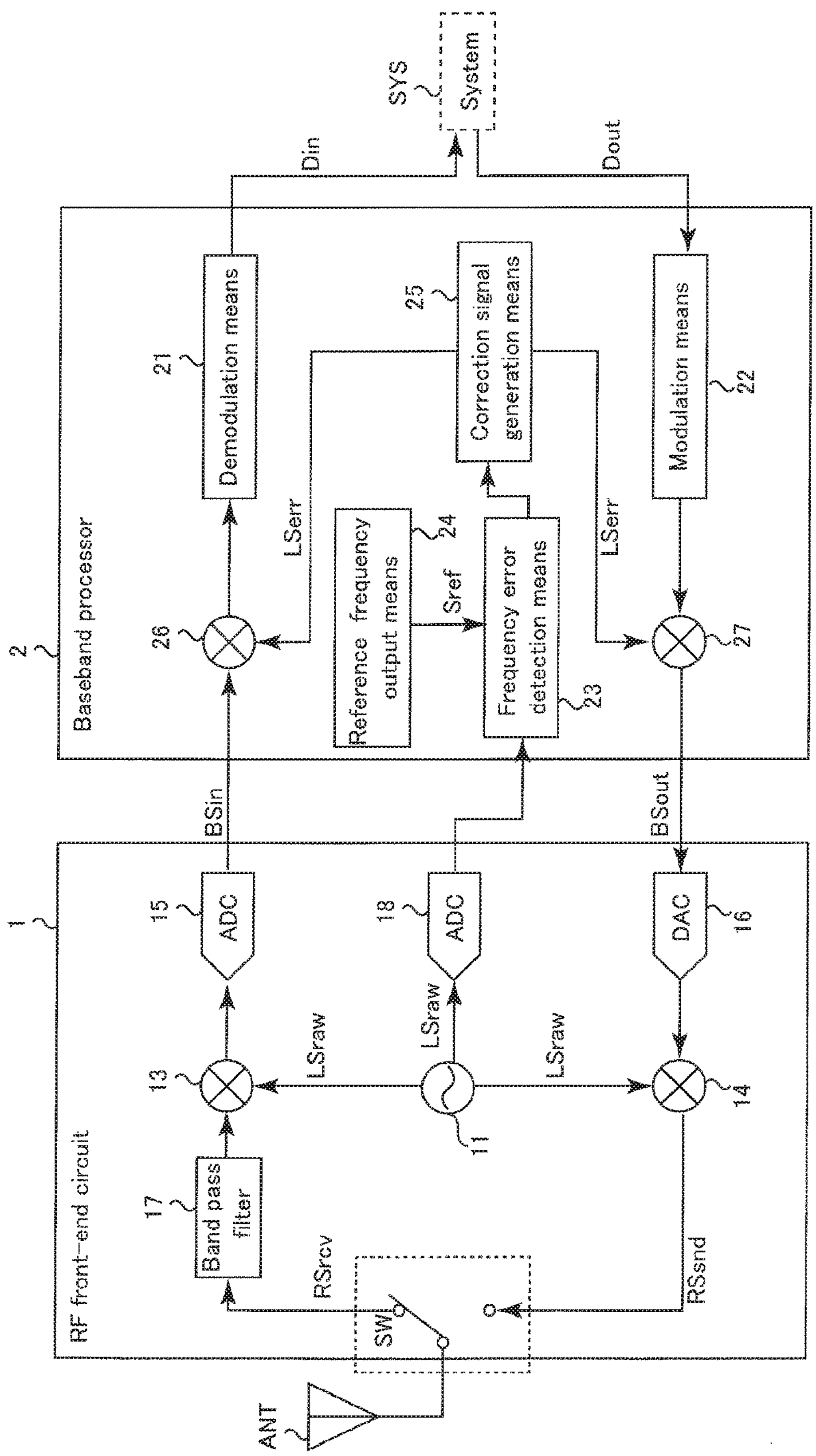
FIG. 6 shows a block diagram showing a wireless transmission/reception circuit according to embodiment 2 of the present invention.

FIG. 6 is a block diagram showing a wireless transmission/reception circuit according to embodiment 2 of the present invention. In this embodiment, structural elements that are essentially the same as those in embodiment 1 are represented by the same reference numbers, and the explanations thereof are simplified.

As shown in FIG. 6, the wireless transmission/reception circuit according to the present embodiment includes an antenna ANT that transmits and receives a radio signal; an RF front-end circuit 1 that converts a reception signal RSrcv received by the antenna ANT to a baseband input signal BSin, and converts a baseband output signal BSout to a transmission signal RSsnd to be transmitted by the antenna ANT; and a baseband processor 2 that demodulates the baseband input signal BSin to generate input data Din to a system SYS, and modulates the output data Dout from the system SYS to generate the baseband output signal BSout.

The RF front-end circuit 1 includes an SAW oscillator 11; a transmission/reception switch SW that switches transmission and reception by the antenna ANT; a bandpass filter 17 that extracts a signal of a required frequency band from a reception signal RSrcv; a multiplier 13 that multiplies the reception signal RSrcv after being processed by the bandpass filter 17 by a SAW oscillator output signal LSraw, and outputs a baseband input signal BSin; an ADC 15 that converts the baseband input signal BSin to a digital signal; a DAC 16 that converts the baseband output signal BSout to an analog signal; a multiplier 14 that multiplies the baseband output signal BSout converted to an analog signal by the SAW oscillator output signal LSraw; and an ADC 18 that converts the SAW oscillator output signal LSraw to a digital signal.

The baseband processor 2 includes demodulation means 21 that demodulates a baseband input signal BSin and generates input data Din for the system SYS; and modulation means 22 that modulates output data Dout from the system SYS and generates a baseband output signal BSout.

The baseband processor 2 further includes reference frequency signal output means 24 that outputs a reference frequency signal Sref having a reference frequency fref; frequency error detection means 23 that receives an SAW oscillator output signal LSraw that has been subjected to analog-to-digital conversion by the ADC 18 and the reference frequency signal Sref, and calculates a frequency error ferr which is an error between a frequency fraw of the SAW oscillator output signal LSraw and a target frequency ftgt; and correction signal generation means 25 that generates an error correction signal LSerr having the frequency error ferr; a multiplier 26 that multiplies a baseband input signal BSin by the error correction signal LSerr; and a multiplier 27 that multiplies a baseband output signal BSout by the error correction signal LSerr. The target frequency ftgt is an expected frequency of the SAW oscillator output signal LSraw, and a value preset in accordance with a frequency band in which the wireless transmission/reception circuit transmits and receives. It is preferable that the frequency fraw of the SAW oscillator output signal LSraw is equal to the target frequency ftgt; however, the SAW oscillator 11 is affected by external impacts or temperature change in actual cases, and accordingly an error occurs.

In the present embodiment, an SAW oscillator output signal LSraw which is an output of the SAW oscillator 11 is not subjected to frequency stabilization in the RF front-end circuit 1, and the signal is used as an output of a local oscillator. Then, in the baseband processor 2, correction using an error correction signal LSerr is performed prior to demodulation, but after modulation, and an error between the frequency fraw of the SAW oscillator output signal LSraw and the target frequency ftgt is corrected.

Figure 7:
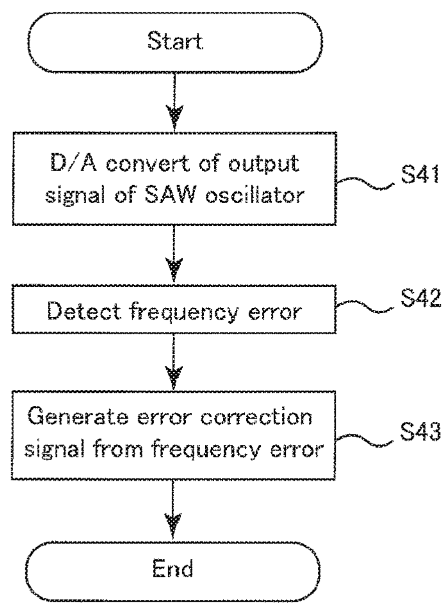
FIG. 7 shows a flowchart of the processing of frequency error detection in embodiment 2 of the present invention.

FIG. 7 is a flowchart showing calculation processing for an error between the frequency fraw of the SAW oscillator output signal LSraw and the target frequency ftgt in the wireless transmission/reception circuit according to the present embodiment. First, in step S41, the ADC 18 converts a SAW oscillator output signal LSraw to a digital signal.

The SAW oscillator output signal LSraw that has been converted to a digital signal and the reference frequency signal Sref from the reference frequency signal output means 24 are input to the frequency error detection means 23, a frequency error ferr of the frequency fraw of the SAW oscillator output signal LSraw to the target frequency ftgt is calculated, and an error correction signal LSerr which is a sine wave having the frequency error ferr is generated in step S43. This processing is similar to the processing using the DSP 122 in the phase locked loop circuit 12 according to embodiment 1.

The error correction signal LSerr generated in the aforementioned processing is used for correction processing in demodulation and modulation processing that will be explained later.

Figure 8:
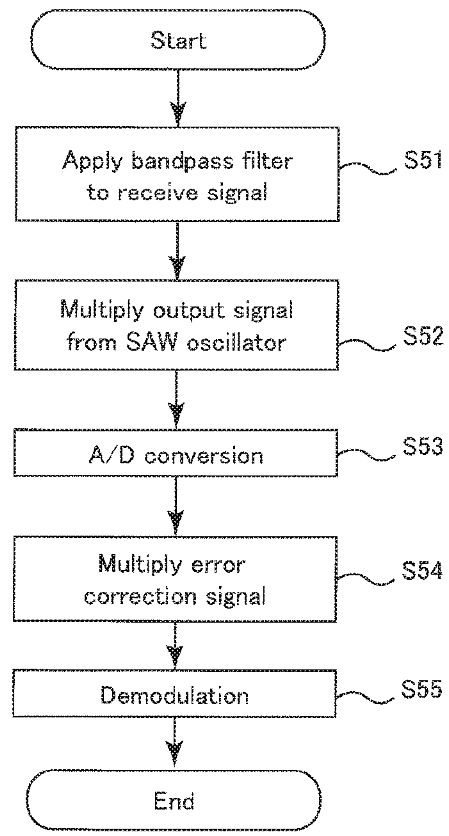
FIG. 8 shows a flowchart of the data receiving processing in embodiment 2 of the present invention.

FIG. 8 is a flowchart showing the processing of demodulating a reception signal RSrcv and obtaining input data Din by the wireless transmission/reception circuit according to the present embodiment. First, in step S51, the bandpass filter 17 is applied to a reception signal RSrcv to extract only a signal in a required frequency band from the reception signal RSrcv.

Then, the processing proceeds to step S52. The multiplier 13 multiplies the reception signal RSrcv after application of the band pass filter and the SAW oscillator output signal LSraw to generate a baseband input signal BSin. Since the SAW oscillator output signal LSraw is used for downconverting of the reception signal RSrcv, the baseband input signal BSin includes an error component between the frequency fraw of the SAW oscillator output signal LSraw and the target frequency ftgt at this stage.

In step S53, the baseband input signal BSin is converted to a digital signal. In step S54, the multiplier 26 multiplies the baseband input signal BSin converted to the digital signal by the error correction signal LSerr. By this processing, effects due to an frequency error of the SAW oscillator output signal LSraw to the target frequency ftgt can be negated.

In step S55, the demodulation means 21 demodulates an output signal from the multiplier, and generate input data Din for the system SYS. The processing is terminated by this step.

Figure 9:
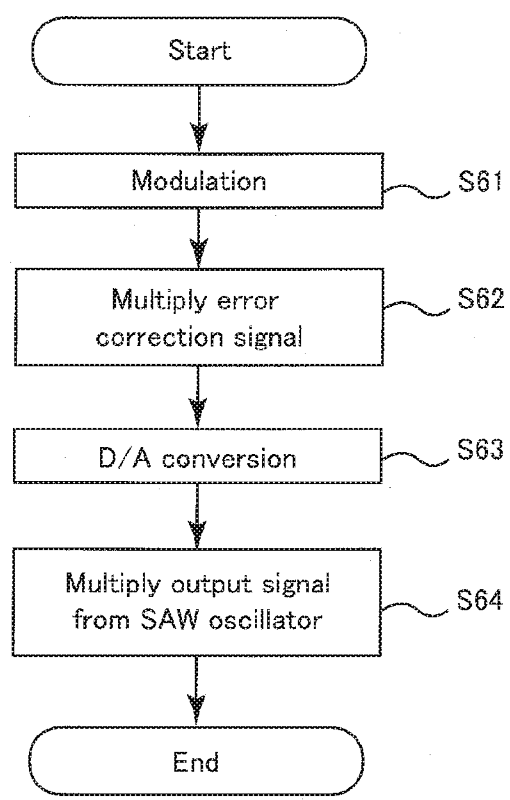
FIG. 9 shows a flowchart of the data transmission processing in embodiment 2 of the present invention.

FIG. 9 is a flowchart showing the processing of modulating output data Dout of the system SYS and obtaining a transmission signal RSsnd by the wireless transmission/reception circuit according to the present embodiment. First, in step S61, output data Dout from the system SYS is modulated, and a baseband output signal BSout is generated. A frequency error of the frequency fraw of the SAW oscillator output signal LSraw to the target frequency ftgt in the baseband output signal BSout is not considered at this stage.

In step S62, the multiplier 27 multiplies the baseband output signal BSout by the error correction signal LSerr so that a correction component of the frequency error of the frequency fraw of the SAW oscillator output signal LSraw to the target frequency ftgt is included in the baseband output signal BSout.

Specifically, this processing is performed to increase the frequency of the baseband output signal BSout by the frequency error ferr by multiplication at the multiplier 27 when the frequency fraw of the SAW oscillator output signal LSraw is smaller than the target frequency ftgt (ftgt>fraw), and to decrease the frequency of the baseband output signal BSout by the frequency error ferr by multiplication at the multiplier 27 when the frequency fraw of the SAW oscillator output signal LSraw is greater than the target frequency ftgt (ftgt<fraw). By this processing, it is possible to obtain a transmission signal RSsnd that has not been affected by a frequency error when multiplying the baseband output signal BSout by the SAW oscillator output signal LSraw in the latter step S64.

In step S63, the DAC 16 converts the baseband output signal BSout to an analog signal, and in the subsequent step S64, multiplication of the baseband output signal BSout that has been converted to an analog signal and the SAW oscillator output signal LSraw is performed to generate a transmission signal RSsnd to be transmitted from the antenna ANT. At this stage, the frequency error that the SAW oscillator output signal LSraw has is cancelled by the correction component included in the baseband output signal BSout in step S62, and the transmission signal RSsnd is not affected by the frequency error.

The receiving processing as shown in FIG. 8 and the transmission processing as shown in FIG. 9 may be performed respectively by switching the transmission/reception switch.

As stated above, by using the wireless transmission/reception according to the present embodiment, even if the SAW oscillator 11 is used as a local oscillator without performing frequency stabilization in the phase locked loop circuit, a frequency error can be corrected by digital calculation in the baseband processor.

This configuration can decrease the number of DACs by adopting only DAC 16 that converts the baseband output signal BSout to an analog signal in comparison with embodiment 1 in which the phase locked loop circuit 12 needs to comprise the DAC 124 that converts the error correction signal LSerr to an analog signal and the DAC 16 that converts the baseband output signal BSout to an analog signal. Accordingly, it is possible to realize downsizing of the circuit or power saving.

In addition, the baseband processor 2 is implemented by using the DSP, and processes digital calculation. Accordingly, addition of structural elements such as multipliers 26 and 27 for error correction to the baseband processor 2 can be accomplished by addition of logical processing blocks within the DSP. This can suppress increase of the size of circuit, power consumption, and manufacturing costs in comparison with the case of adding multipliers as analog elements.

In addition, if the multipliers 13, the multipliers 14, ADC 15, DAC 16, ADC 18, demodulation means 21, modulation means 22, and frequency error detection means 23, etc. are configured as a single integrated circuit (IC), further downsizing of the wireless transmission/reception circuit is realized.

In the present embodiment, the system SYS may be selected discretionary from systems that request transmission/reception of data, and the wireless transmission/reception circuit may be used for various wireless communication devices such as terminal devices, for example, a mobile phone or a smart phone terminal, and facilities, for example, a base station of a mobile phone, etc.

Embodiment 3

Figure 10:
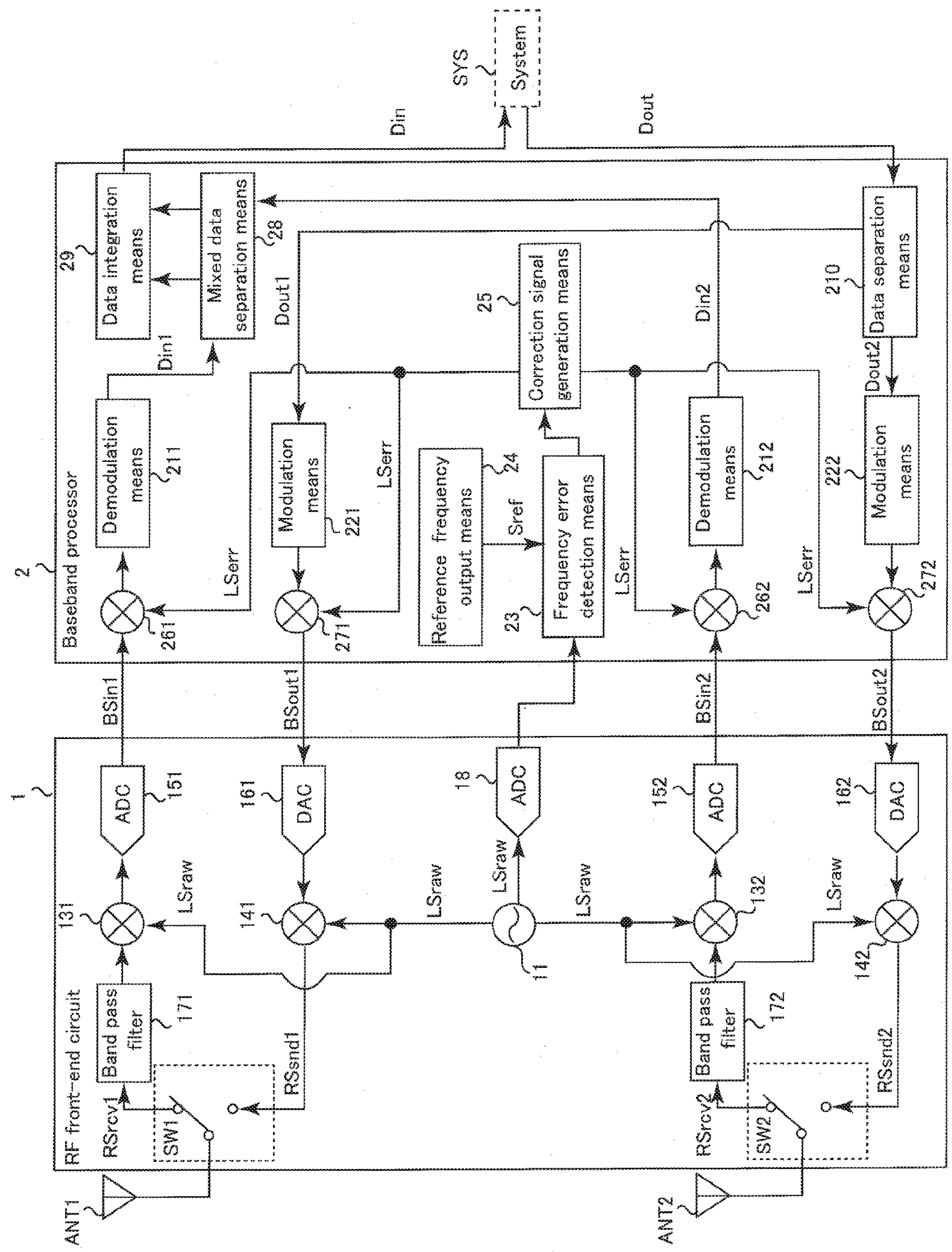
FIG. 10 shows a block diagram showing a wireless transmission/reception circuit according to embodiment 3 of the present invention.

FIG. 10 is a block diagram showing the wireless transmission/reception circuit according to the present embodiment. In this embodiment, structural elements that are essentially the same as those in embodiments 1 and 2 are represented by the same reference numbers, and the explanations thereof are simplified.

As shown in FIG. 10, the wireless transmission/reception circuit according to the present embodiment includes two antennas, an antenna ANT1 and an antenna ANT2, that perform transmission/reception of a wireless signal; an RF front-end circuit 1 that converts a reception signal RSrcv1 and a reception signal RSrcv2 received by the antennas ANT1 and ANT2 to a baseband input signal BSin1 and a baseband input signal BSin2, and converts a baseband output signal BSout1 and a baseband output signal BSout2 to a transmission signal RSsnd1 and a transmission signal RSsnd2 to be transmitted by the antennas ANT1 and ANT2; and a baseband processor 2 that performs output of input data Din to a system SYS by demodulation and data integration of the baseband input signals BSin1 and BSin2, and output of the baseband output signals BSout1 and BSout2 by data division and modulation of the output data Dout from the system SYS.

The wireless transmission/reception circuit according to the present embodiment includes two systems of transmission/reception circuits, is corresponds to the MIMO technique, and realizes greater increase of the communication capacity than the wireless transmission/reception circuit that includes only one transmission/reception circuit system.

The RF front-end circuit 1 includes an SAW oscillator 11, and an ADC 18 that converts an SAW oscillator output signal LSraw to a digital signal, which are shared by the two systems of transmission/reception circuits.

The RF front-end circuit 1 also includes the following elements in the first transmission/reception system: a transmission/reception switch SW1 that switches transmission and reception by the antenna ANT1; a bandpass filter 171 that extracts a signal of a required frequency band from a reception signal RSrcv1; a multiplier 131 that multiplies the reception signal RSrcv1 passed through bandpass filter 171 by an SAW oscillator output signal LSraw, and outputs a baseband input signal BSin1; an ADC 151 that converts a baseband input signal BSin1 to a digital signal; a DAC 161 that converts a baseband output signal BSout1 to an analog signal; and a multiplier 141 that multiplies the baseband output signal BSout1 converted to an analog signal by the SAW oscillator output signal LSraw.

Similarly, the RF front-end circuit 1 includes the following elements in the second transmission/reception system: a transmission/reception switch SW2 that switches transmission and reception by the antenna ANT2; a bandpass filter 172 that extracts a signal of a required frequency band from a reception signal RSrcv2; a multiplier 132 that multiplies the reception signal RSrcv2 passed through the bandpass filter 172 by an SAW oscillator output signal LSraw, and outputs a baseband input signal BSin2; an ADC 152 that converts a baseband input signal BSin to digital signal; a DAC 162 that converts a baseband output signal BSout2 to an analog signal; and a multiplier 142 that multiplies the baseband output signal BSout2 converted to an analog signal by the SAW oscillator output signal LSraw.

As stated above, the RF front-end circuit 1 includes a pair of elements each used in one of the two transmission/reception systems, except for the SAW oscillator 11 and the ADC 18 that are shared by the two transmission/reception systems.

The baseband processor 2 includes the following elements that are used in the first transmission/reception system: demodulation means 211 that demodulates a baseband input signal BSin1 and outputs input data Din1; and modulation means 221 that modulates output data Dout1 and outputs a baseband output signal BSout1.

Similarly, the baseband processor 2 includes the following elements that are used in the second transmission/reception system: demodulation means 212 that demodulates a baseband input signal BSin2 and outputs input data Din2; and modulation means 222 that modulates output data Dout2 and outputs a baseband output signal BSout2.

In addition, the baseband processor 2 includes mixed data separation means 28 that receives input data Din1 and Din2 demodulated by the demodulation means 211 and 212 and separates mixed data from input data Din1 and Din2, in order to eliminate an effects of the mixed data generated by the antennas ANT1 and ANT2; data integration means 29 that integrates input data Din1 and Din2 in which mixed data has been eliminated by the mixed data separation means 28, and generates input data Din for the system SYS; and data separation means 210 that separates the output data Dout received from the system SYS into output data Dout1 and Dout2.

Furthermore, the baseband processor 2 includes elements shared by the two transmission/reception systems: reference frequency signal output means 24 that outputs a reference frequency signal Sref having a reference frequency fref; frequency error detection means 23 that receives a SAW oscillator output signal LSraw that has been converted to a digital signal by the ADC 18 and the reference frequency signal Sref, and detects a frequency error ferr of a frequency fraw of an SAW oscillator output signal LSraw to a target frequency ftgt; correction signal generation means 25 that generates an error correction signal LSerr having the frequency error ferr; a multiplier 26 that multiplies a baseband input signal BSin by the error correction signal LSerr; and a multiplier 27 that multiplies a baseband output signal BSout by the error correction signal LSerr. The target frequency ftgt is an expected frequency of the SAW oscillator output signal LSraw, and a predetermined value in accordance with a frequency band in which the wireless transmission/reception circuit transmits and receives. It is preferable that the frequency fraw of the SAW oscillator output signal LSraw is equal to the target frequency ftgt; however, the SAW oscillator 11 is affected by external impacts or temperature change in actual cases, and accordingly a frequency error occurs.

In the present embodiment, a frequency of an SAW oscillator output signal LSraw from the SAW oscillator 11 is not stabilized in the RF front-end circuit 1, and the SAW oscillator output signal LSraw is used as an output of a local oscillator. Then, in the baseband processor 2, correction using an error correction signal LSerr is performed prior to demodulation, but after modulation to correct a frequency error of the frequency fraw of the SAW oscillator output signal LSraw to the target frequency ftgt.

The detection of a frequency error of a frequency fraw of an SAW oscillator output signal LSraw to the target frequency ftgt and the generation of an error correction signal LSerr are processed similarly to the processing explained with reference to FIG. 7 in embodiment 2, by means of the frequency error detection means 23. The generated error correction signal LSerr is used for correction processing in demodulation and modulation processing that will be explained later.

Figure 11:
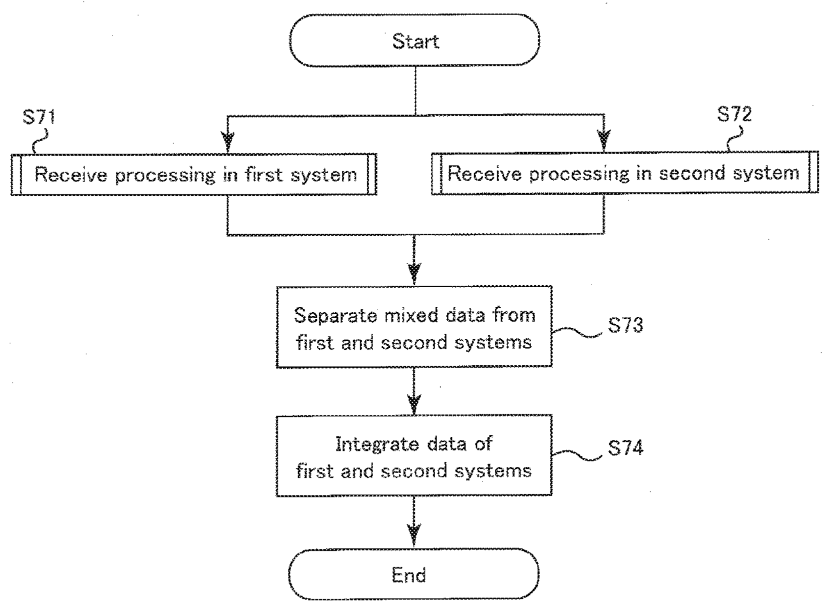
FIG. 11 shows a flowchart of the data receiving processing in embodiment 3 of the present invention.

FIG. 11 is a flowchart showing the processing of demodulation and data integration of a reception signals RSrcv1 and RSrcv2 to generate input data Din by the wireless transmission/reception circuit according to the present embodiment. First, in step S71, the first transmission/reception system demodulates a reception signal RSrcv1 received by the antenna ANT1 to generate input data Din1. This processing is to process similar to that explained with reference to FIG. 8 in embodiment 2, by means of the bandpass filter 171, the multiplier 131, the ADC 151, the multiplier 261 and the demodulation means 211.

As explained with reference to FIG. 8, in the demodulation processing, after a baseband input signal BSin1 input to the baseband processor 2 is multiplied by the error correction signal LSerr, demodulation by the demodulation means 211 is performed. By this procedure, input data Din1 can be generated without receiving effects due to a frequency error of the frequency fraw of the SAW oscillator output signal LSraw to the target frequency ftgt.

In step S72, the second transmission/reception system demodulates a reception signal RSrcv2 received by the antenna ANT2 to generate input data Din2 in the similar manner to the demodulation in the first transmission/reception system, by means of the bandpass filter 172, the multiplier 132, the ADC 152, the multiplier 261, and the demodulation means 212.

Then, in step S73, the generated input data Din1 and input data Din2 are input to the mixed data separation means 28 to eliminate effects of mixed data generated by the antennas ANT1 and ANT2, and in step S74, input data Din1 and Din2 are integrated by the data integration means 29, and input data Din is output to the system SYS.

Figure 12:
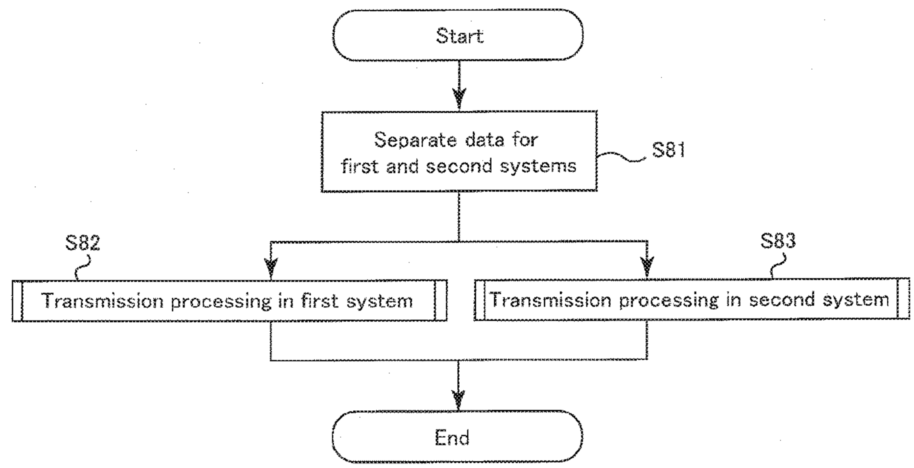
FIG. 12 shows a flowchart of the data transmission processing in embodiment 3 of the present invention.

FIG. 12 is a flowchart showing the processing of performing data division and modulation to the output data Dout to obtain transmission signals RSsnd1 and RSsnd2 by the wireless transmission/reception circuit according to the present embodiment. First, in step S81, the output data Dout is separated into output data Dout1 to be output from the first transmission/reception system and output data Dout2 to be output from the second transmission/reception system by the data separation means 210.

In step S82, the first transmission/reception system modulates output data Dout1 to generate a transmission signal RSsnd1 to be transmitted by the antenna ANT1. This processing is to process similar to that explained with reference to FIG. 9 in embodiment 2, by means of the modulation means 221, the multiplier 271, the ADC 161, and the demodulation means 141.

In this modulation processing, as explained with reference to FIG. 9, after output data Dout2 is modulated by the modulation means 22, multiplication of the error correction signal LSerr is performed so that a component for correcting a frequency error of the frequency fraw of the SAW oscillator output signal LSraw to the target frequency ftgt is included in the baseband output signal BSout in advance. By this procedure, a frequency error is canceled when multiplying a baseband output signal BSout by an SAW oscillator output signal LSraw from the local oscillator.

In step S83, the second transmission/reception system modulates output data Dout2 to generate a transmission signal RSsnd2 to be transmitted by the antenna ANT2 in the similar manner to the modulation in the first transmission/reception system, by means of the modulation means 222, the multiplier 272, the DAC 162, and the multiplier 142.

The receiving processing as shown in FIG. 11 and the transmission processing as shown in FIG. 12 may be performed respectively by switching the transmission/reception switch.

As stated above, the wireless transmission/reception circuit according to the present embodiment realizes not only increase of the communication capacity by applying the high spectral purity of the SAW oscillator, and but also increase of the communication capacity by applying multiple transmission/reception systems.

In the present embodiment, an example where two transmission/reception systems are comprised is explained. However, more than two transmission/reception systems can be comprised to realize increase of the communication capacity.

In the present embodiment, the system SYS may be selected discretionary from systems that request transmission/reception of data, and the wireless transmission/reception circuit may be used for various wireless communication devices such as terminal devices, for example, a mobile phone or a smart phone terminal, and facilities, for example, a base station of a mobile phone, etc.

In addition, a structure capable of performing beam forming in that the modulation means 221 and 222 perform phase control to control the orientation or the distance of radio waves to be transmitted from the antennas ANT1 and ANT2 may be adopted. With such a structure, it is possible to more effectively transmit radio waves than the case where the wireless transmission/reception circuit according to the present embodiment is applied to the base station facilities for mobile phones, etc.

The concept of the present invention has been developed in consideration of the situation where the oscillation frequency of the SAW oscillator is fixed, and the frequency control cannot be made, namely, the oscillation frequency of the SAW oscillator cannot be controlled. This concept essentially includes an oscillation apparatus that generates a signal having a target frequency different from the oscillation frequency of the SAW oscillator that cannot be controlled. For example, it is expected that an oscillation of a target frequency of 21 GHz is generated from the SAW oscillator with the oscillation frequency of 20 GHz. The output of the SAW oscillator in which the frequency has been shifted can be adopted to the postprocessing such as IQ modulation, etc.

With reference to FIG. 1, the aforementioned oscillation apparatus can eliminate the need to comprise the ADC 121, the frequency error detection means 122*a*, and the reference frequency output means 123, and can include an SAW oscillator 11 that generates a first signal having the oscillation frequency, a signal generator that generates a second signal having a frequency different from the oscillation frequency, which is substituted by the correction signal generation means 122*b*, the DAC 124, and a signal composite unit (multiplier 125) that combines the first signal and the second signal to generate a third signal having a target frequency different from the oscillation frequency.

The invention claimed is:

1. A wireless transmission/reception circuit that converts a reception signal received by an antenna to input data and converts output data to a transmission signal to be transmitted from the antenna, the wireless transmission/reception circuit comprising:

a local oscillator;

a first analog-to-digital converter (ADC) that converts an output signal from the local oscillator to a digital signal;

reference frequency output means that outputs a reference frequency signal;

frequency error detection means that detects a frequency error based on an output signal from the first ADC and the reference frequency signal;

correction signal generation means that generates an error correction signal based on the frequency error;

a first multiplier that multiplies the reception signal by the output signal from the local oscillator, and generates a baseband input signal;

a second ADC that converts the baseband input signal to a digital signal;

a second multiplier that multiplies an output signal from the second ADO by the error correction signal;

demodulation means that demodulates an output signal from the second multiplier, and outputs the input data;

modulation means that modulates the output data;

a third multiplier that multiplies an output signal from the modulation means by the error correction signal, and outputs a baseband output signal;

a digital-to-analog converter (DAC) that converts the baseband output signal to an analog signal; and a fourth multiplier that multiplies an output signal from the DAC by the output signal from the local oscillator, and generates a transmission signal.

2. The wireless transmission/reception circuit according to claim 1, wherein the local oscillator is a surface acoustic wave (SAW) oscillator.

3. A mobile wireless communication terminal apparatus comprising the wireless transmission/reception circuit according to claim 1.

4. A mobile wireless communication terminal apparatus comprising the wireless transmission/reception circuit according to claim 2.

5. A wireless transmission/reception circuit that converts a first reception signal received by a first antenna and a second reception signal received by a second antenna to input data, and converts output data to a first transmission signal to be transmitted from the first antenna and a second transmission signal to be transmitted from the second antenna, the wireless transmission/reception circuit comprising:

a local oscillator;

a first analog-to-digital converter (ADC) that converts an output signal from the local oscillator to a digital signal;

reference frequency output means that outputs a reference frequency signal;

frequency error detection means that detects a frequency error based on an output signal from the first ADC and the reference frequency signal;

correction signal generation means that generates an error correction signal based on the frequency error;

a first multiplier that multiplies the first reception signal by the output signal from the local oscillator, and generates a first baseband input signal;

a second multiplier that multiplies the second reception signal by the output signal from the local oscillator, and generates a second baseband input signal;

a second ADC that converts the first baseband input signal to a digital signal;

a third ADC that converts the second baseband input signal to a digital signal;

a third multiplier that multiplies an output signal from the second ADC by the error correction signal;

a fourth multiplier that multiplies an output signal from the third ADC by the error correction signal;

first demodulation means that demodulates an output signal from the third multiplier, and outputs first demodulated data;

second demodulation means that demodulates an output signal from the fourth multiplier, and outputs second demodulated data;

data integration means that integrates the first demodulated data and the second demodulated data, and generates the input data;

data separation means that separates the output data into first modulation target data and second modulation target data;

first modulation means that modulates the first modulation target data;

second modulation means that modulates the second modulation target data;

a fifth multiplier that multiplies an output signal from the first modulation means by the error correction signal, and outputs a first baseband output signal;

a sixth multiplier that multiplies an output signal from the second modulation means by the error correction signal, and outputs a second baseband output signal;

a first digital-to-analog converter (DAC) that converts the first baseband output signal to an analog signal;

a second DAC that converts the second baseband output signal to an analog signal;

a seventh multiplier that multiplies an output signal from the first DAC by the output signal from the local oscillator, and generates a first transmission signal; and an eighth multiplier that multiplies an output signal from the second DAC by the output signal from the local oscillator, and generates a second transmission signal.

6. The wireless transmission/reception circuit according to claim 5, wherein the local oscillator is a surface acoustic wave (SAW) oscillator.

7. A mobile wireless communication terminal apparatus comprising the wireless transmission/reception circuit according to claim 5.

8. A mobile wireless communication terminal apparatus comprising the wireless transmission/reception circuit according to claim 6.

* * * * *